(12) United States Patent
Nystrom et al.

(10) Patent No.: US 7,735,225 B2
(45) Date of Patent: Jun. 15, 2010

(54) METHOD OF MANUFACTURING A CAST-IN PLACE INK FEED STRUCTURE USING ENCAPSULANT

(75) Inventors: Peter J. Nystrom, Webster, NY (US); John P. Meyers, Rochester, NY (US)

(73) Assignee: Xerox Corporation, Norwalk, CT (US)

( * ) Notice: Subject to any disclaimer, the term of this patent is extended or adjusted under 35 U.S.C. 154(b) by 584 days.

(21) Appl. No.: 11/694,899

(22) Filed: Mar. 30, 2007

(65) Prior Publication Data

US 2008/0239002 A1   Oct. 2, 2008

(51) Int. Cl.
*B21D 53/76* (2006.01)
(52) U.S. Cl. .................. 29/890.1; 29/841; 347/47
(58) Field of Classification Search ............. 29/890.1, 29/611, 25.35, 841, 854; 347/44, 47, 58
See application file for complete search history.

(56) References Cited

U.S. PATENT DOCUMENTS 5,751,316 A * 5/1998 Bailey et al. ........... 29/890.1 X 6,461,798 B1 * 10/2002 Ohkuma et al. ........ 29/890.1 X

FOREIGN PATENT DOCUMENTS

JP    02030541 A  *  1/1990  ............. 29/890.1 X

* cited by examiner

*Primary Examiner*—A. Dexter Tugbang
(74) *Attorney, Agent, or Firm*—MH2 Technology Law Group LLP

(57) ABSTRACT

A method of forming an enclosed fluid path in a print head includes providing a die member and a truncated nozzle plate spaced from the upper surface of the die member. The die and nozzle plate are formed on a print head substrate having an aperture formed therein. A sacrificial material is seated over the aperture of the print head substrate and joins a terminal end of the truncated nozzle plate. The sacrificial material is encapsulated from the terminal end of the nozzle plate to a surface of the print head substrate. Removal of the sacrificial material defines the fluid path from the aperture of the print head substrate to the nozzle plate.

10 Claims, 4 Drawing Sheets

METHOD OF MANUFACTURING A CAST-IN PLACE INK FEED STRUCTURE USING ENCAPSULANT

DESCRIPTION OF THE INVENTION

1. Field of the Invention

The present invention generally relates to an ink jet print head, and more particularly, forming a fluid interconnect for a printing die element.

2. Background of the Invention

In the fabrication of ink jet devices, passageways are provided to connect an ink supply, such as a reservoir, to nozzle outlets in the print head. These passageways can be made at the edge of a die, or through holes in a bottom surface of the die. Feeding ink from a bottom of the device can use valuable space in the device and feeding ink from the edge can require an architecturally complicated device.

An example of a typical fluidic micro-electromechanical system (MEMS) print head device 100 is illustrated in FIGS. 1A and 1B at sequential stages of assembly. In particular, FIG. 1A illustrates a silicon wafer 110 supporting a transducer 112 and a bond pad 114. A fluid chamber 160 is formed on the silicon wafer 110 by a nozzle plate 130 distanced from the silicon wafer 110 with generalized support member 150. At least one nozzle opening 140 is formed in the nozzle plate 130 and at least one fluid inlet 120 is formed in the silicon wafer 110. In FIG. 1B, the device of FIG. 1A is shown placed onto a print head substrate 170, wirebonded 116, and sealed with encapsulant 190 at ends of the silicon wafer 110, print head substrate 170, and nozzle plate 130 junctions. An aperture 180 is formed in the print head substrate 170.

In known fabrication of semiconductor devices of the type described above, when the device of FIG. 1A is placed on the print head substrate 170, alignment of the ink inlet 120 with the aperture 180 of the print head substrate 170 can be problematic to achieve. Further, the area of the ink inlet 180 can be about 100×200 μm to facilitate deep reactive ion etching through the silicon wafer 110. In addition to consuming valuable space on the silicon wafer, reactive ion etching is an expensive process. For example, a per wafer etch time on the order of about five hours can be needed to form a 500 to 600 μm deep ink inlet. In addition to the time required for forming the ink inlet, an overall area of the silicon wafer must be large enough to accommodate formation of the ink inlet as well as allow for alignment tolerances, resulting in about a 20% margin at the edge of the silicon wafer. Typically, this margin is used for support member 150 of the nozzle plate 130.

The amount of silicon and surface area required for forming a fluid interconnect is typically defined by a combination of the ink inlet 120 and margin. In a typical MEMS ink jet device, the die can be about 2000 μm wide. If the total overhead of the ink inlet represents 200 μm, for example, a potential 10% reduction in usable space of the die results. On a 150 mm wafer, a 2 mm×12 mm die size yields 563 die. If the die width is reduced, for example, by 10% 1.8 mm), a yield of 624 die per wafer can be obtained. Accordingly, the die yield can be directly proportional to a reduction in the size of the cut die. This can become particularly important for architectures having large array designs where both die size and array size are important fabrication considerations.

Thus, there is a need to overcome these and other problems of the prior art and to provide a method for forming an ink feed structure in an ink jet print head, which reduces a size of die used in the method and resulting device.

SUMMARY OF THE INVENTION

In accordance with the present teachings, a method of forming an enclosed fluid path in a print head is provided.

The exemplary method can include providing a die member and a truncated nozzle plate spaced from the upper surface of the die member. The die and nozzle plate are formed on a print head substrate having an aperture formed therein. A sacrificial material is seated over the aperture of the print head substrate and joins a terminal end of the truncated nozzle plate. The sacrificial material is encapsulated from the terminal end of the nozzle plate to a surface of the print head substrate. Removal of the sacrificial material defines the fluid path from the aperture of the print head substrate to the nozzle plate.

In accordance with the present teachings, a print head is provided.

The exemplary print head can include a die member supporting at least one bond pad and at least one transducer and a truncated nozzle plate spaced from the die member, the nozzle plate positioned over the at least one transducer. A print head substrate supports the die member, the print head substrate having an aperture formed therein, A sacrificial material is positioned over the aperture of the print head substrate and abuts both a terminal end of the nozzle plate and an edge of the die member. An encapsulant is formed to bridge sacrificial material between the print head substrate and terminal end of the nozzle plate to seal the sacrificial material therein. Removal of the sacrificial material from the print head defines an enclosed fluid path within the print head.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the exemplary embodiments of the invention, examples of which are illustrated in the accompanying drawings. However, one of ordinary skill in the art would readily recognize that the same principles are equally applicable to, and can be implemented in devices other than ink jet printers, and that any such variations do not depart from the true spirit and scope of the present invention. Moreover, in the following detailed description, references are made to the accompanying figures, which illustrate specific embodiments. Electrical, mechanical, logical and structural changes may be made to the embodiments without departing from the spirit and scope of the present invention The following detailed description is, therefore, not to be taken in a limiting sense and the scope of the present invention is defined by the appended claims and their equivalents. Wherever possible, the same reference numbers will be used throughout the drawings to refer to the same or like parts.

Embodiments pertain generally to MEMS type ink jet print heads, and more particularly to the fluid feed structures thereof. Although the embodiments are described in connection with structures for "fluid", it will be appreciated that the fluid can be ink, biologic fluid, industrial fluid, or chemical fluid, by way of non-limiting examples.

Figure 2:
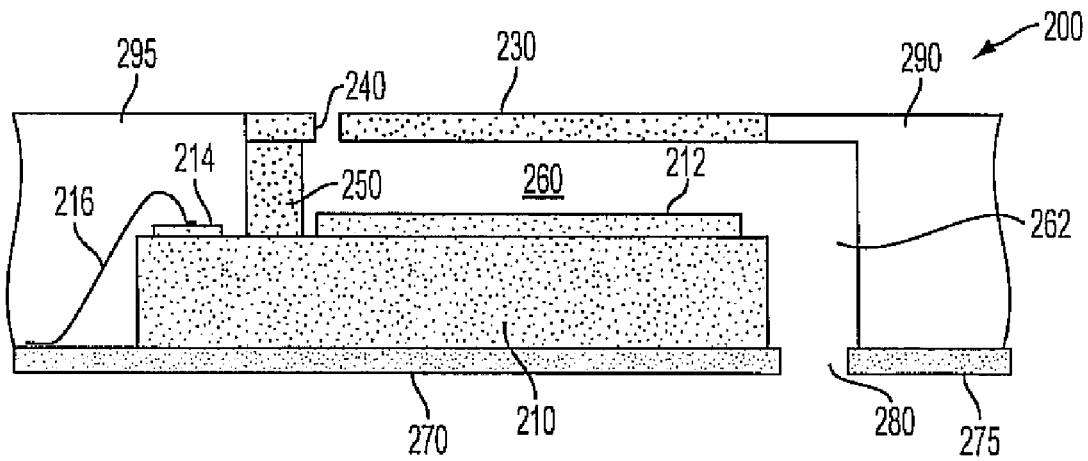
FIG. 2 is a side sectional view illustrating a print head in accordance with embodiments of the present teachings.

FIG. 2 illustrates a completed print head structure 200 according to exemplary embodiments and includes a print head substrate 270 and a die 210 formed on the print head substrate 270. The print head substrate 270 includes an aperture 280 formed therein. Components of the die 210 can include a transducer 212, a bond pad 214 connected to the print head substrate 270 by a wirebond 216, and a truncated nozzle plate 230 positioned above the die 210. The nozzle plate 230 includes at least one nozzle opening 240 formed therein. Further, the nozzle plate 230 can be spaced from the die 210 by a support member 250 adjacent the bond pad end of the die 210 and an encapsulant 290 at the truncated end of the die 210. For example, encapsulant 290 can be provided from the terminal end of the nozzle plate 230 to a surface of the print head substrate 275 outside of the print head aperture 280. Further encapsulant 295 can be provided on the device at bond pad 214/wirebond 216 region.

The structure depicted in FIG. 2 defines a fluid chamber 260 formed between the nozzle plate 230 and die 210 as defined by the encapsulant 290. In addition, a fluid path 262 can be defined by a region between the edge of the die 210 and the encapsulant 290. Accordingly, fluid can enter the print head from the print head aperture 280, flow through the fluid path 262 to the fluid chamber 260, and exit the print head via the print head nozzle 240.

Further, it will be appreciated that truncation of the nozzle plate is with respect to known nozzle plates, and is not necessarily intended to convey a shortening of the nozzle plate except as described in the following.

With the structure illustrated in FIG. 2, a known function of the print head 200 can occur. More specifically, the transducer within the print head operates to eject fluid from an opening in the nozzle plate 240.

Turning now to FIGS. 3A through 3D, fabrication of the print head 300 and corresponding fluid feed structures will be described in further detail. It will be appreciated that FIGS. 3A through 3D are simplified for the purposes of explanation and that other steps and components may added or existing steps and components may be removed or modified.

Figure 1A:
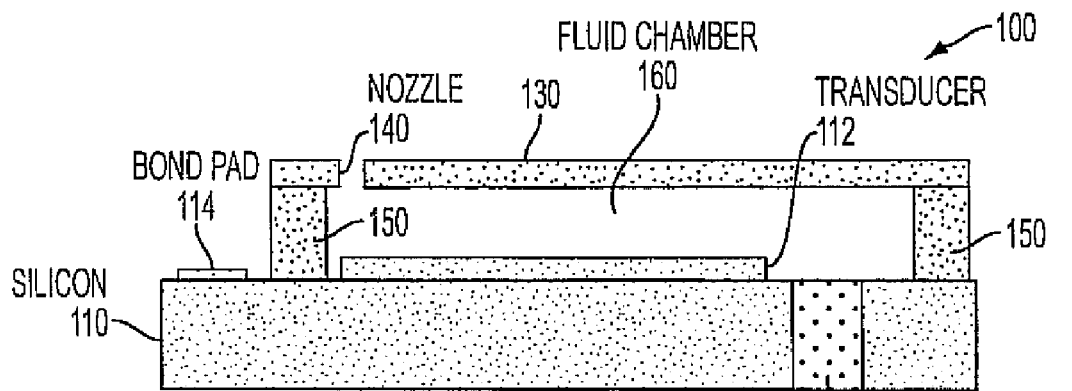
FIGS. 1A and 1B depict side views of a known MEMS jet print head in sequential stages of assembly.
Figure 1B:
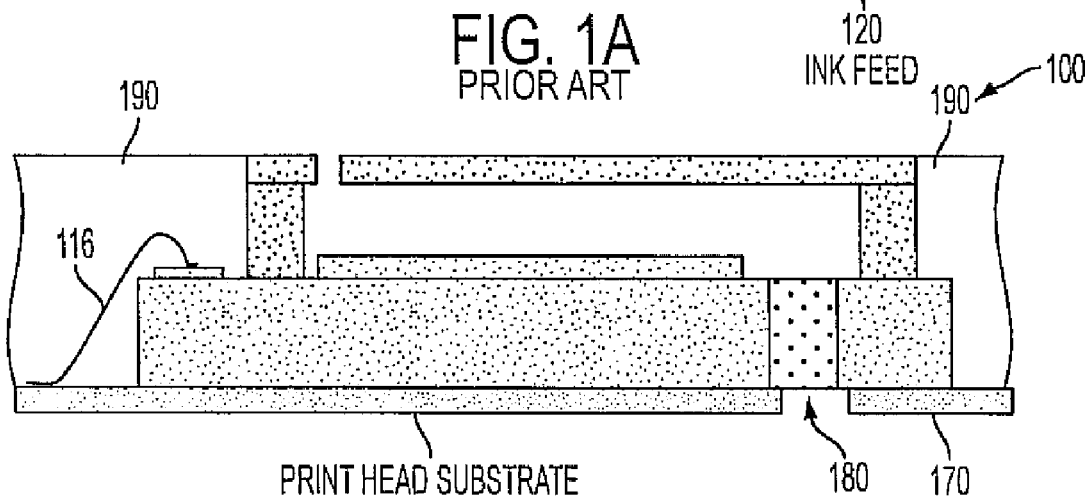
Figure 3A:
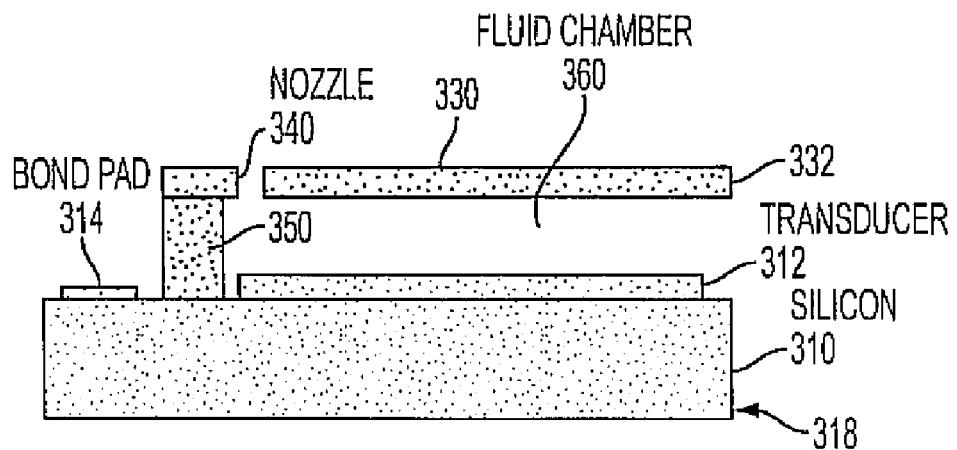
FIGS. 3A through 3D are side views depicting stages of fabrication of the print head in accordance with embodiments of the present teachings.

Referring first to FIG. 3A, the print head 300 can include the die 310, with transducer 312 and bond pad 314 components formed on the die 310 in a known manner. By way of example, the die 310 can comprise silicon. Further, the truncated nozzle plate 330 can be spaced from the die 310 by a support arm 350 or the like such that a distance of the nozzle plate from the die defines a fluid chamber 360 for the print head 300. At least one dispensing nozzle 340 is formed in the nozzle plate 330 for dispensing fluid from the chamber 360 in response to actuation by the transducer 312. The nozzle plate 330 is depicted initially as a truncated member, and will be supported at the terminal end 332 of the nozzle plate 330 by other components. As illustrated, the terminal end 332 of the nozzle plate 330 aligns with an edge 318 of the die 310. The transducer 312 can be set in from the edge of the die 310 as shown. It will be appreciated that the truncated nozzle plate 330 is a departure from known nozzle plates which are supported as illustrated in FIGS. 1A and 1B. In effect, transducer 312 is surrounded on three sides, similar to a "comb" shape.

Figure 3B:
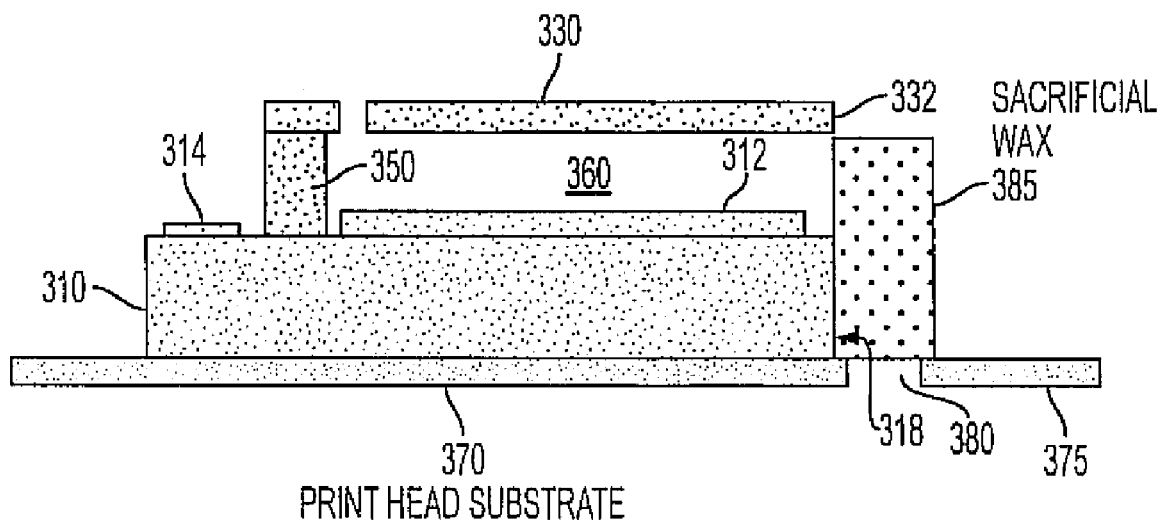

Turning now to FIG. 3B, the die 310 is mounted to the print head substrate 370 in a known manner. In addition, an aperture 380 is formed in the print head substrate 370 and can be the first point of entry for fluid to enter the print head 300. As illustrated, the edge 318 of the die 310 can be positioned adjacent to the aperture 380 of the print head substrate 370. The edge of the die can at times be set in from the aperture 380 by a predetermined distance, and can also be formed to overlap the aperture slightly according to various tolerances, as long as the ink flow is not impeded by the die. A sacrificial material 385 is positioned over the aperture 380 of the print head substrate 370 and abutting each of the die edge 318 and aligned with the terminal end 332 of the nozzle plate 330. In effect, the sacrificial material seats in a manifold area at ends of the comb-shaped walls as described above. The alignment of the sacrificial material 385 can be either by overlapping the terminal end 332 of the nozzle plate 330 or by a corner to corner joining as shown in FIG. 3A. In either case, the sacrificial material 385 can be situated to straddle the aperture 380 of the print head substrate 370.

Figure 3C:
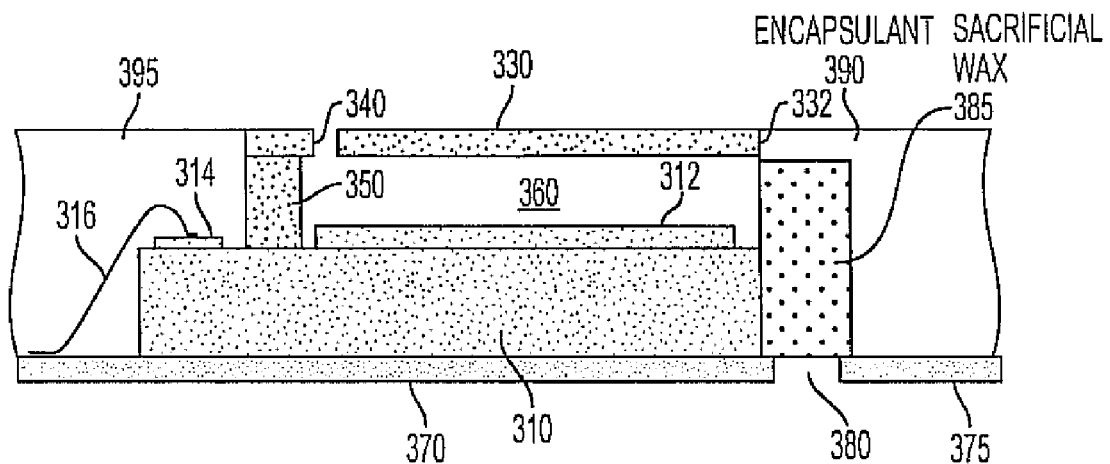

As illustrated in FIG. 3C, a wirebond 316 can be used to join the bond pad 314 with the print head substrate 370 in a known manner. Next, a curable encapsulant 390, 395 can be formed over portions of the print head 300. More specifically, the encapsulant 395 can be formed to protect the bond pad 314 and wirebond 316 as is known in the art. In addition, the encapsulant 390 can be formed over the sacrificial material 385 from the print head substrate 375 outside the print head aperture 380 to the terminal end 332 of the nozzle plate 330.

Also in FIG. 3C, the encapsulant 390, 395 can be cured using any known curing method. For example, a standard heat cure can be used to cure the encapsulant. In addition, and by way of example only, any of a two-part room temperature cure, an ultraviolet cure, or a snap cure with a very short and high temperature time can be used to cure the encapsulant. The cured encapsulant 390 forms a seal over the sacrificial material 385 and completes a bridge from the terminal end 332 of the nozzle plate 330 to the print head substrate 375. By way of further example, the encapsulant can be a molding compound injected into a mold for which the present device has an insert.

Figure 3D:
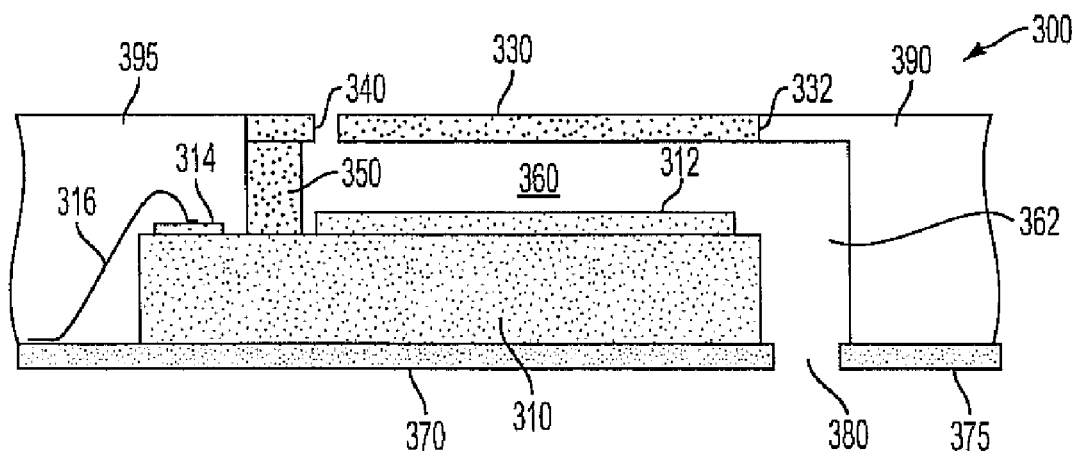

Referring now to FIG. 3D, the sacrificial material can be removed to obtain the final print head 300 as shown. The removal can be by heating the sacrificial material 385 such that it drains from the print head 300 through the aperture 380 of the print head substrate 370. In addition, the sacrificial material 385 can be removed by using an appropriate solvent to dissolve the sacrificial material. Removal of the sacrificial material 385 results in a defined fluid path from the aperture 380 of the print head substrate 370 to the fluid chamber 360 via path 362, and to the nozzle outlet 340 of the nozzle plate 330. Further, this fluid path is obtained in the absence of a significant amount of the die 310, thereby reducing overall silicon consumption for the print head.

It will be appreciated that the method used to remove the sacrificial material 385 can be dependent upon the type of sacrificial material used. As an example, the sacrificial material can be a wax such as Apiezon Wax W having a 130° C. melt, a 90° C. softening, and hydrocarbon (i.e. Hexane) soluble. As another example, the sacrificial material can be a wax such as Aremco Crystalbond 590 having a 150° C. flow point, and isopropyl alcohol solubility or soluble with a proprietary solvent.

The sacrificial material 385 can be applied to the print head 300 in a number of ways. For example, the sacrificial material can be flowed into the die by melting prior to dicing, which can yield an additional benefit of cleanliness. In another example, the sacrificial material can be preformed pieces placed after die bonding. In yet another example, a heated dispensing of the sacrificial material can be performed after die placement to protect ink passages.

Figure 4:
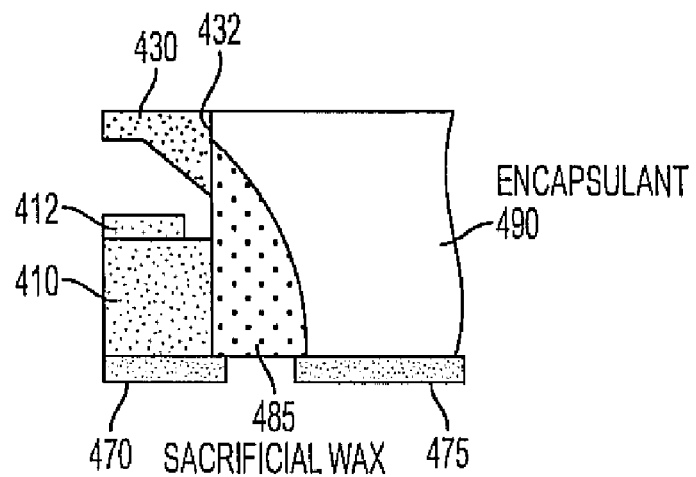
FIG. 4 is a side view illustrating an exemplary profile of sacrificial material in the exemplary print head in accordance with embodiments of the present teachings.

An example of a shape of the sacrificial material 485 formed by dispensing is illustrated in FIG. 4. When the material is dispensed, a more relaxed profile of the sacrificial material can be obtained. For example, a profile of the sacrificial material can be arcuate.

The terminal end 432 of the nozzle plate 430 is shown in FIG. 4 to have a triangular shaped end. With the triangular shaped end, tolerances for the encapsulant 490 and sacrificial material 485 need not be as rigid.

Figure 5:
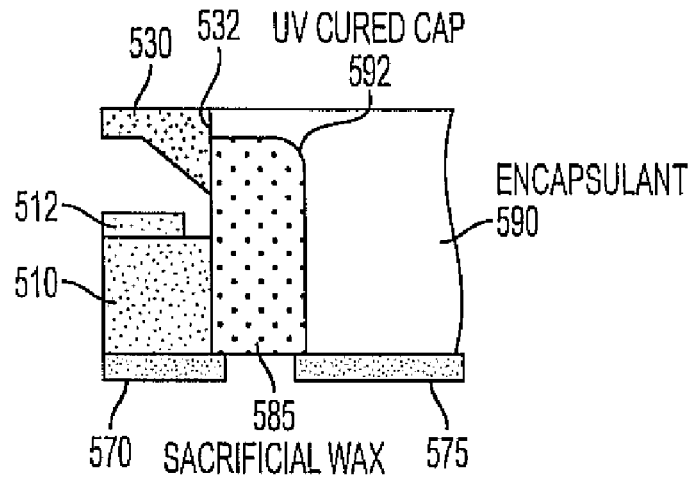
FIG. 5 is a side view illustrating additional support for a portion of the print head in accordance with embodiments of the present teachings.

Referring now to FIG. 5, the nozzle plate 530 is depicted with a thin, truncated end 532. In the event of a thin nozzle plate end in the print head, tolerances can be controlled by applying a thin coating to a surface of the sacrificial material 585 prior to applying the encapsulant 590. The thin coating can be a UV curable coating suitable for forming a crust 592 within the encapsulant 590 upon removing the sacrificial material 585. It will be appreciated that the crust 592 can be stronger and more durable than, or otherwise reinforce the encapsulant, thus providing an added strength to the bridge region connecting the nozzle plate 530 to the print head substrate 575.

Figure 6:
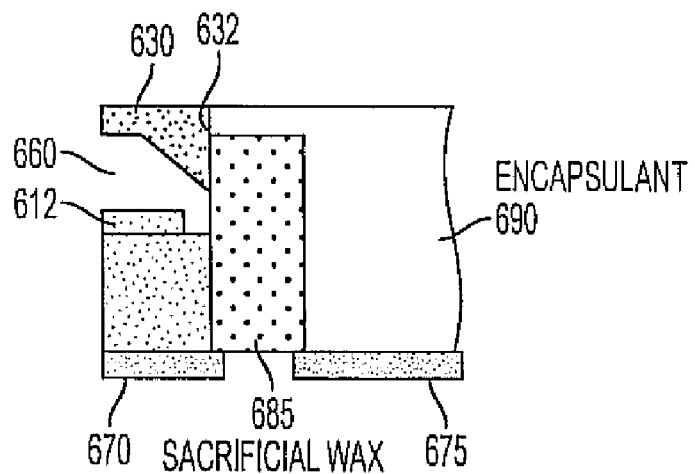
FIG. 6 is a side view illustrating a terminal end of a nozzle plate in accordance with embodiments of the present teachings.

As depicted in FIG. 6, the terminal end 632 of the nozzle plate 630 can be shaped to render a pyramid shaped fluid chamber 660. The terminal end 632 can be formed using ODE (Orientation Dependent Etching) or anisotropic etching of silicon. In the event that The nozzle plate is etched out of silicon, crystal planes within the wafer can be used to form self-terminating structures. When the die are singulated, the cut line is placed such that a portion of the terminal slope is captured, thereby generating a larger end wall for a relaxed tolerance in the print head.

Although the relationships of components are described in general terms, it will be appreciated by one of skill in the art can add, remove, or modify certain components without departing from the scope of the exemplary embodiments.

It will be appreciated by those of skill in the art that several benefits are achieved by the exemplary embodiments described herein and include a reduced silicon real estate for the die. Since die size is directly proportional to cost, this can correspondingly reduce cost of the print head. A further benefit is reduced alignment constraints with respect to the print head substrate. Likewise, a wider variety of methods can be used to attach the die to the print head because there is no danger of the die accidentally plugging the openings of the print head substrate. Even further, uniformity of fabrication can reduce cross talk between ink jets. In addition, use of the sacrificial "plug" can reduce particulate contamination of ink passages because the material need not be removed until the print head is put into use.

While the invention has been illustrated with respect to one or more exemplary embodiments, alterations and/or modifications can be made to the illustrated examples without departing from the spirit and scope of the appended claims. In particular, although the method has been described by examples, the steps of the method may be performed in a difference order than illustrated or simultaneously. In addition, while a particular feature of the invention may have been disclosed with respect to only one of several embodiments, such feature may be combined with one or more other features of the other embodiments as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." And as used herein, the term "one or more of" with respect to a listing of items such as, for example, "one or more of A and B," means A alone, B alone, or A and B.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any an all sub-ranges between (and including) the minimum value of zero and the maximum value of 10, that is, any and all sub-ranges having a minimum value of equal to or greater than zero and a maximum value of equal to or less than 10, e.g., 1 to 5.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

What is claimed is:

1. A method of forming an enclosed fluid path in a print head comprising:
   providing a die member;
   forming a truncated nozzle plate spaced from an upper surface of the die member;
   providing a print head substrate and an aperture formed in the print head substrate;
   positioning the die member on a surface of the print head substrate with an edge of the die member and a terminal end of the truncated nozzle plate being adjacent to the aperture of the print head substrate;
   placing a sacrificial material over the aperture of the print head substrate and joining the terminal end of the truncated nozzle plate;
   encapsulating the sacrificial material from the terminal end of the nozzle plate to the surface of the print head substrate; and
   removing the sacrificial material to define the fluid path from the aperture of the print head substrate to the nozzle plate.

2. The method of claim 1, wherein the fluid path includes a fluid inlet at the edge of the die.

3. The method according to claim 2, wherein the fluid path further includes a fluid chamber between the die and the truncated nozzle plate.

4. The method according to claim 1, further comprising forming a coating between the sacrificial material and the encapsulant.

5. The device according to claim 4, wherein the coating comprises a UV curable coating.

6. The method according to claim 1, further comprising providing a support member at one end of the nozzle plate for spacing the nozzle plate from the die member.

7. The method according to claim 1, wherein positioning the die member includes positioning the die member adjacent the aperture of the print head substrate.

8. The method according to claim 1, further comprising:
  providing at least one bond pad and at least one transducer on an upper surface of the die member;
  forming a wirebond connecting the bond pad to the print head substrate; and
  wherein the step of encapsulating also encapsulates the at least one bond pad and corresponding wirebond.

9. The method according to claim 1, wherein the removing of the sacrificial material comprises melting.

10. The method according to claim 1, wherein the removing of the sacrificial material comprises a dissolving with a solvent.

* * * * *